(12) United States Patent
Yoneda et al.

(10) Patent No.: US 7,939,836 B2
(45) Date of Patent: May 10, 2011

(54) SEMICONDUCTOR LIGHT EMITTING ELEMENT

(75) Inventors: Akinori Yoneda, Anan (JP); Akiyoshi Kinouchi, Komatsushima (JP)

(73) Assignee: Nichia Corporation, Anan (JP)

( * ) Notice: Subject to any disclaimer, the term of this patent is extended or adjusted under 35 U.S.C. 154(b) by 263 days.

(21) Appl. No.: 12/216,464

(22) Filed: Jul. 3, 2008

(65) Prior Publication Data

US 2009/0020769 A1 Jan. 22, 2009

(30) Foreign Application Priority Data

Jul. 18, 2007 (JP) ................................. 2007-187686
Oct. 19, 2007 (JP) ................................. 2007-272377
Jun. 19, 2008 (JP) ................................. 2008-159821

(51) Int. Cl.
*H01L 33/00* (2010.01)

(52) U.S. Cl. ................ 257/88; 257/91; 257/92; 257/99; 257/E33.025; 257/E33.062; 257/E33.065

(58) Field of Classification Search .................... 257/99, 257/88, 91, 92, E33.062, E33.065, E33.025
See application file for complete search history.

(56) References Cited

U.S. PATENT DOCUMENTS

| | | | |
|---|---|---|---|
| 6,828,596 B2 | 12/2004 | Steigerwald et al. | |
| 2005/0253156 A1* | 11/2005 | Horio et al. | 257/94 |
| 2006/0231852 A1* | 10/2006 | Kususe et al. | 257/99 |
| 2007/0241348 A1 | 10/2007 | Inoue et al. | |
| 2008/0142821 A1 | 6/2008 | Sakamoto et al. | |
| 2008/0258158 A1* | 10/2008 | Yoneda et al. | 257/88 |

FOREIGN PATENT DOCUMENTS

| | | |
|---|---|---|
| JP | 2000-174348 A | 6/2000 |
| JP | 2002-319705 A | 10/2002 |
| JP | 2004-56109 A | 2/2004 |
| JP | 2005-197289 A | 7/2005 |
| JP | 2006-19347 A | 1/2006 |
| JP | 2006019347 A * | 1/2006 |
| JP | 2007-311764 A | 11/2007 |
| JP | 2008-34821 A | 2/2008 |
| JP | 2008-34822 A | 2/2008 |
| WO | WO-2008/047325 A2 | 4/2008 |

OTHER PUBLICATIONS

JP 2006-019347 A—machine translation.*

* cited by examiner

*Primary Examiner* — David S Blum
(74) *Attorney, Agent, or Firm* — Birch, Stewart, Kolasch & Birch, LLP

(57) ABSTRACT

A semiconductor light emitting element having a rectangular shape in plan view comprising at least a first side and a second side adjacent to the first side, the semiconductor light emitting element including a first conductivity-type semiconductor layer, a second conductivity-type semiconductor layer, a plurality of first electrodes having a long shape along the first side and being arranged on the first conductivity-type semiconductor layer in a lattice form of x columns ($x \geq 2$) along the first side and y rows ($y > x$) along the second side, and a second electrode arranged on the second conductivity-type semiconductor layer. The first electrode and the second electrode are arranged on the same surface side. The first electrode is surrounded by the first conductivity-type semiconductor layer, the second conductivity-type semiconductor layer, and the second electrode is provided.

20 Claims, 6 Drawing Sheets

(a)

(b)

(c)

(d)

(e)

(f)

SEMICONDUCTOR LIGHT EMITTING ELEMENT

CROSS-REFERENCE TO RELATED APPLICATIONS

The present application claims priority under 35 U.S.C. §119 to Japanese Patent Application No. 2007-187686, filed Jul. 18, 2007, Japanese Patent Application No. 2007-272377, filed Oct. 19, 2007, and Japanese Patent Application No. 2008-159821, filed Jun. 19, 2008. The contents of these applications are incorporated herein by reference in their entirety.

BACKGROUND OF THE INVENTION

1. Field of the Invention

The present invention relates to semiconductor light emitting elements, in particular, to a semiconductor light emitting element configured with a pair of electrodes formed on the same surface side of the semiconductor light emitting element.

2. Discussion of the Background

In the semiconductor light emitting element including a stacked structure of the semiconductor layer, various research developments on the shape and the arrangement of each electrode are being conventionally performed to realize high output. For example, Japanese Laid-Open Patent Publication No. 2002-319705 discloses such a light emitting element. One example is shown in FIG. 8. The light emitting element shown in FIG. 8 has the n-side electrode and the p-side electrode arranged on the same surface side, where a feeding section 81 of the n-side electrode and a feeding section 82 of the p-side electrode are arranged at equidistance alternately at a total of three in the lateral direction and alternately at a total of three in the vertical direction to form an electrode arrangement configuration of matrix form. The semiconductor light emitting element is known to be mounted so as to be conductive on a submount having an electrode pattern formed on the surface. For example, Japanese Laid-Open Patent Publication No. 2000-174348 discloses such a light emitting element.

However, the current flowing to the element cannot be sufficiently evened by simply arranging the feeding section of the n-side electrode and the feeding section of the p-side electrode at equal distance as the light emitting element shown in FIG. 8. When forming the p-electrode and the n-electrode on the same surface side, one electrode needs to be formed on the semiconductor layer surface with one part of the light emitting region removed and exposed. Thus, if the electrode area is simply increased to even the current distribution, the light emitting area decreases, the output of the entire element lowers, and the light emitting efficiency lowers.

SUMMARY OF THE INVENTION

According to one aspect of the present invention, a semiconductor light emitting element having a rectangular shape in plan view including at least a first side and a second side adjacent to the first side, the semiconductor light emitting element comprising a first conductivity-type semiconductor layer, a second conductivity-type semiconductor layer, a plurality of first electrodes having a long shape along the first side and being arranged on the first conductivity-type semiconductor layer in a lattice form of x columns (x≧2) along the first side and y rows (y>x) along the second side, and a second electrode arranged on the second conductivity-type semiconductor layer. The first electrode and the second electrode are arranged on the same surface side. The first electrode is surrounded by the first conductivity-type semiconductor layer, the second conductivity-type semiconductor layer, and the second electrode.

According to another aspect of the present invention, a semiconductor light emitting element having a rectangular shape in plan view including at least a first side and a second side adjacent to the first side, the semiconductor light emitting element comprising a first conductivity-type semiconductor layer, a second conductivity-type semiconductor layer, a plurality of first electrodes having a long shape along the first side and being arranged on the first conductivity-type semiconductor layer in a lattice form of x columns (x≧2) along the first side and y rows (y>x) along the second side, and a second electrode arranged on the second conductivity-type semiconductor layer. The first electrode and the second electrode are arranged on the same surface side. The first electrode is surrounded by the first conductivity-type semiconductor layer, the second conductivity-type semiconductor layer, and the second electrode. A distance $D_1$ is larger than a distance $D_2$. $D_1$ is a distance between the first electrodes in the row direction, and $D_2$ is a distance between the first electrodes in the column direction.

According to further aspect of the present invention, a semiconductor light emitting element having a rectangular shape in plan view including at least a first side and a second side adjacent to the first side, the semiconductor light emitting element comprising a first conductivity-type semiconductor layer, a second conductivity-type semiconductor layer, a plurality of first electrodes having a long shape along the first side and being arranged on the first conductivity-type semiconductor layer in a lattice form of x columns (x≧2) along the first side and y rows (y>x) along the second side, and a second electrode arranged on the second conductivity-type semiconductor layer. The first electrode and the second electrode are arranged on the same surface side. The first electrode is surrounded by the first conductivity-type semiconductor layer, the second conductivity-type semiconductor layer, and the second electrode. The plurality of first electrodes are arranged at essentially equidistance in the row direction. A distance $D_1$ is larger than a distance $D_3$. $D_1$ is a distance between the first electrodes in the row direction, and $D_3$ is a distance between the first electrode closest to the second side and an end of the second conductivity-type semiconductor layer on the second side.

According to the present invention, a semiconductor light emitting element in which the potential difference in the element can be reduced, the forward voltage can be reduced, and the light emitting efficiency is enhanced can be realized.

BRIEF DESCRIPTION OF THE DRAWINGS

The invention, together with objects and advantages thereof, may best be understood by reference to the following description of the presently preferred embodiment together with the accompanying drawings in which.

DESCRIPTION OF THE EMBODIMENTS

Embodiments of the semiconductor light emitting element of the present invention will be described in detail based on the drawings.

First Embodiment

Figure 1:
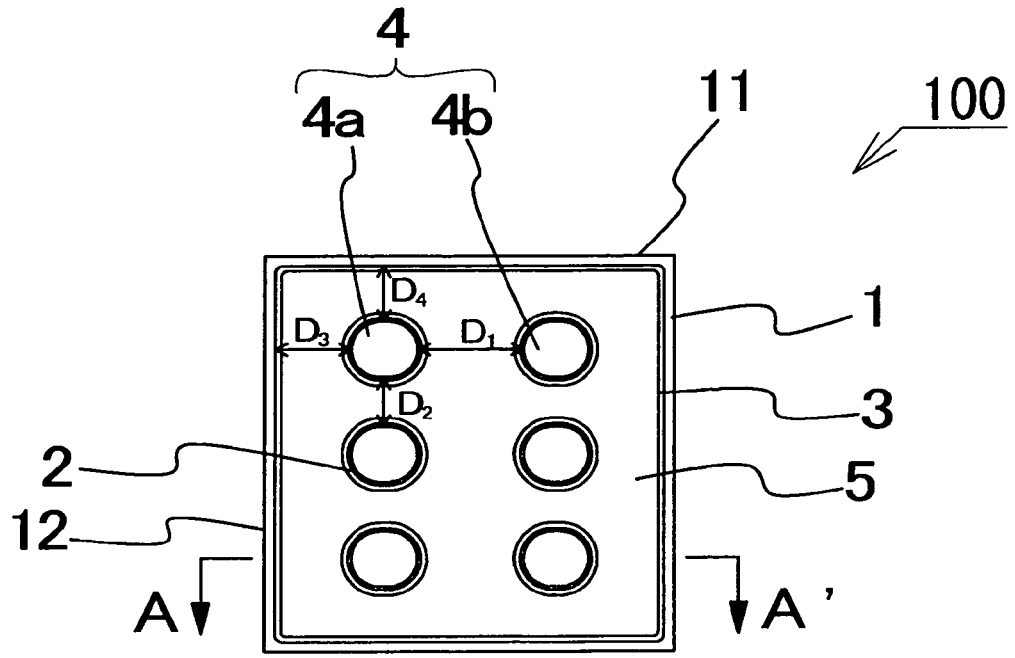
FIG. 1 is a schematic plan view showing a semiconductor light emitting element according to a first embodiment of the present invention.
Figure 2:
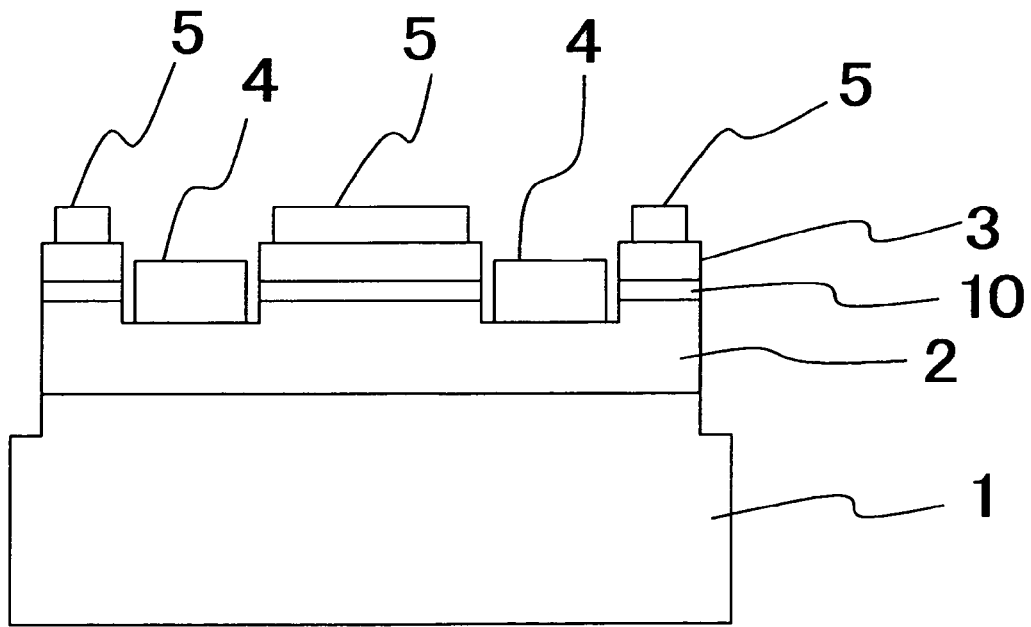
FIG. 2 is a schematic cross sectional view showing a cross section taken along line A-A' of the semiconductor light emitting element shown in FIG. 1.

As shown in FIGS. 1 and 2, a semiconductor light emitting element 100 of the present embodiment has a first conductivity-type semiconductor layer 2, a light emitting layer 10, and a second conductivity-type semiconductor layer 3 stacked in order on a transparent substrate 1. A first electrode 4 is formed on the first conductivity-type semiconductor layer 2, and a second electrode 5 is formed on the second conductivity-type semiconductor layer 3. The semiconductor light emitting element 100 has a substantially square shape in plan view. The second conductivity-type semiconductor layer 3, the light emitting layer 10, and one part of the first conductivity-type semiconductor layer 2 are removed, the surface of the first conductivity-type semiconductor layer 2 is exposed. The first electrode 4 is formed on the exposed surface of the first conductivity-type semiconductor layer 2. That is, the first electrode 4 and the second electrode 5 are arranged on the same surface side of the semiconductor layer. The second electrode 5 is arranged so as to surround the periphery of the first electrode 4. The first electrode 4 is a shape being long along a first side 11 of the element. The first electrode 4 is arrayed in a lattice form of two columns along the first side 11 and three rows along a second side 12 adjacent to the first side.

The first electrode 4 is arrayed in a lattice form of x columns ($x \geq 2$) along the first side 11 and y rows ($y > x$) along the second side 12 as shown in FIG. 1. The shape of the first electrode 4 is a shape extending in the longitudinal direction and a short-side direction, where the longitudinal direction lies along the first side 11. That is, the first electrode 4 is long in the row direction. Such first electrodes 4 are arrayed so as to be larger in amount in the rows lying along the second side 12 than the columns lying along the first side 11 so that current is spread, whereby the current distribution of the entire element tends to be evened, the potential difference can be reduced, and the forward voltage can be reduced. According to the shape and the arrangement of the first electrodes, the current distribution can be evened without requiring an extending part, and the light emitting area can be widened. Therefore, according to the configuration described above, the bias of the current distribution is alleviated to even the light emission intensity distribution, increase in the area of the first electrodes is suppressed, a wide light emitting area can be ensured while the forward voltage is reduced, and the light emitting efficiency can be enhanced.

The first electrode 4 is preferably arranged substantially evenly over the entire element. The current can thereby flow evenly over the entire element, the first electrode can serve as an external electrode connecting part for connecting with an external electrode through a conductive member such as a bump, and thus heat resistance can be reduced. The first electrodes 4 preferably have the distance between the first electrodes in the longitudinal direction of the first electrode larger than the distance between the first electrodes in other direction as in the element of FIG. 1 rather than being arranged completely at equidistance. That is, the first electrodes 4 are preferably arranged such that the distance $D_1$ between the first electrodes in the row direction of the lattice arrangement is larger than the distance $D_2$ between the first electrodes in the column direction.

The first electrode is preferably arranged such that the distance $D_1$ between the first electrodes in the row direction is larger than the distance $D_3$ between the first electrode 4a closest to the second side 12 and the end of the second conductivity-type semiconductor layer 3 on the second side. This is due to the following reasons. In the element, the range in which the current can efficiently spread to the light emitting region including the light emitting layer is assumed to be substantially constant from the end of the first electrode. The current density tends to be small in the region outside such range, and the current tends to concentrate in the region overlapping such range. Furthermore, if the end of the semiconductor layer on outer side of the element is included in the range of the current spread, the current also tends to concentrate. Thus, according to such configuration, a structure in which the range of the current spread of the adjacent first electrodes 4a and 4b is less likely to overlap can be obtained. If the distance between the first electrodes is too far apart, a region of low current density forms between the first electrodes, and thus the distance $D_1$ is preferably smaller than or equal to twice the distance $D_3$. In the column direction, a plurality of first electrodes 4 are preferably arranged at equidistance, where the distance $D_2$ between the first electrodes shown in FIG. 1 can be made to substantially the same as or smaller than the distance $D_4$ between the first electrode 4a closest to the first side 11 and the end of the second conductivity-type semiconductor layer 3 on the first side.

As shown in FIG. 1, arrangement can be made so that the distance $D_1$ between the first electrodes 4a and 4b adjacent in the direction of the first side 11 becomes larger than the distance between the first electrode and the first side 11 and/or the distance between the first electrode and the second side 12. Current can easily flows between the first electrodes than at other portions, and thus current can be evenly supplied to the light emitting layer 10 over the entire of the light emitting element according to such arrangement. Furthermore, as shown in FIG. 1, the semiconductor light emitting element preferably has the first side 11 and the second side 12 of substantially equal length, in which case the arrangement of the first electrodes is preferably such that the number of rows is a number close to the number of columns. In the present embodiment, the number of rows is a number that one is added to the number of columns.

The first electrode 4 has a shape having a longitudinal direction along the first side 11 of the element. The first electrode 4 preferably has a longitudinal direction in a direction parallel to the first side 11. The longitudinal directions of all the first electrodes are preferably the same. The shape and the size are preferably the same in all the first electrodes. The shape may be substantially circular, elliptical, oval shape and the like. In the case that the first electrode 4 is arranged with a conductive member such as wire or bump so as to be connected with the external electrode therethrough, the conductive member has sometimes stretched in a specific direction.

For example, when using ultrasonic bonding, it becomes such a tendency. Thus, first electrode 4 is formed to a shape that is long in the same direction as in the present embodiment, so that shift in time of bonding of the conductive member can be absorbed without increasing the electrode area to more than necessary. Thus, the length in the longitudinal direction of the first electrode is preferably set in view of the shift in time of bonding of the conductive member. For instance, when arranging the conductive member so as to be a circle in plan view, the length in the short-side direction of the first electrode is preferably corresponded to the diameter of the conductive member, and the length in the longitudinal direction is that in which the shift in time of bonding is added to the length in the short-side direction.

Each configuration in each embodiment of the present invention will be described in detail.

(First Electrode 4, Second Electrode 5)

The first electrode 4 is arranged on the surface of the first conductivity-type semiconductor layer 2, and the second electrode 5 is arranged on the second conductivity-type semiconductor layer 3 so as to surround the first electrode 4. In particular, if the second conductivity-type layer 3 is a p-type gallium nitride compound semiconductor layer, the current is less likely to spread in the in-plane direction than a n-type gallium nitride compound semiconductor, and thus the second electrode 5 is preferably arranged over substantially the entire surface of the second conductivity-type layer 3. For example, the resistance value of the p-type GaN layer doped with Mg is about 0.1 Ω·mm to 10 Ω·mm. The second electrode 5 may be further arranged with a connection electrode for connecting with the conductive member such as the bump. The formation of the first electrode 4 and the second electrode 5 may be performed through evaporation method or sputtering method after exposing the first conductivity-type layer 2 through methods such as etching a part of semiconductor layers. In the present embodiment, the material of the second electrode 5 is that which reflects the light from the light emitting layer, thus the light can be retrieved from the transparent substrate of the light emitting element. Such material includes Ag, Al, and Rh. In addition, a transparent electrode such as an oxide conductive film such as ITO (complex oxide of indium (In) and tin (Sn)) and ZnO, metal thin film of Ni/Au etc., and the like may be formed over the surface of the p-type semiconductor layer.

(First Conductivity-Type Semiconductor Layer 2, Second Conductivity-Type Semiconductor Layer 3)

The first and second conductivity-type semiconductor layers include those using GaN and other semiconductors, where gallium nitride compound semiconductor ($In_XAl_YGa_{1-X-Y}N$, $0 \leq X$, $0 \leq Y$, $X+Y \leq 1$) is suitably used. A structure of the semiconductor layer includes heterostructure, double heterostructure, or homostructure including MIS junction, PIN junction and PN junction. Various light emitting wavelengths can be selected according to the material of the semiconductor layer and the crystal mixed ratio thereof. A structure having a single quantum well structure or a multi-quantum well structure in which the semiconductor active layer is formed to a thin film producing quantum effect may be arranged between the first conductivity-type semiconductor layer and the second conductivity-type semiconductor layer. When the nitride semiconductor is used, materials such as sapphire, spinel, SiC, Si, ZnO and the like are suitably used for the growing substrate of the semiconductor layer. Sapphire substrate is preferably used to form the nitride semiconductor with satisfactory crystalline at satisfactory mass productivity. In the first and second conductivity-type semiconductor layers, the first conductivity-type is p-type or n-type, and the second conductivity-type is a conductivity different from the first conductivity-type, that is, n-type or p-type. Preferably, the first conductivity-type semiconductor layer is n-type gallium nitride compound semiconductor layer, and the second conductivity-type semiconductor layer is p-type gallium nitride compound semiconductor layer. The semiconductor layers generally can be changed to n-type or p-type semiconductor layer by doping impurities of n-type or p-type.

(Protective Film 30)

Figure 3:
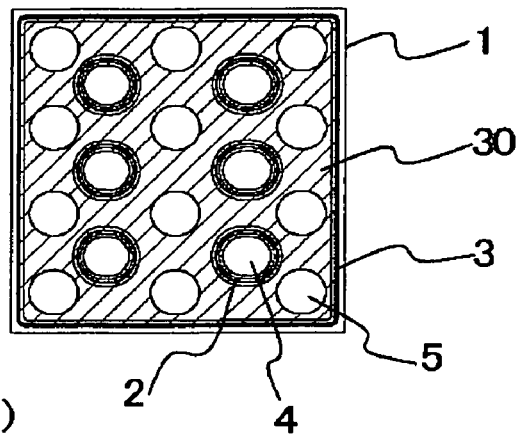
FIGS. 3(a) to 3(f) are six schematic views showing the semiconductor light emitting element according to the first embodiment of the present invention.
Figure 3:
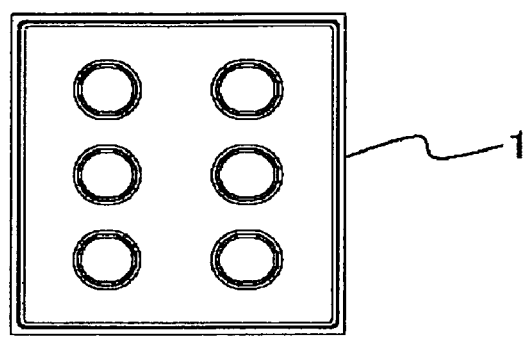
Figure 3:
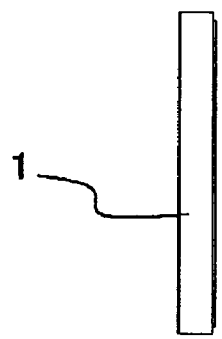
Figure 3:
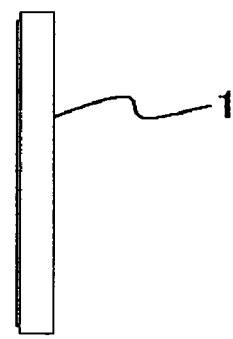
Figure 3:
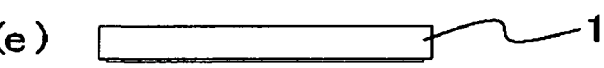
Figure 3:

An insulative protective film may be formed. FIG. 3 shows an example of a semiconductor light emitting element formed with a protective film 30 having an opening on each electrode. FIG. 3(a) is a front view, FIG. 3(b) is a rear view, FIG. 3(c) is a left side view, FIG. 3(d) is a right side view, FIG. 3(e) is a plan view, and FIG. 3(f) is a bottom view. In the rear view shown in FIG. 3(b), each electrode is seen through the transparent substrate 1. The element shown in FIG. 3 is formed with an entire surface electrode for covering substantially the entire surface of the surface of the second conductivity-type semiconductor layer and a cover electrode for covering the entire surface electrode as the second electrode.

The protective film 30 shown with a diagonal line in FIG. 3 has a substantially circular opening on each of the first electrode 4 and the second electrode 5. The surface of the electrode is exposed at each opening. The conducive member such as bump is formed at the surface of each electrode exposed in the opening of the protective film 30, and connected with the conductor wiring etc. of the package so that current flows therethrough. The shape of the opening of the protective film is not particularly limited, and merely needs to be the shape and the size capable of forming the conductive member such as the bump on the surface of each electrode. If corresponded to the shape of the conductive member formed on the electrode as shown in FIG. 3(a), increase in the area of the opening can be suppressed, and the other area of the upper surface of the element can be protected. If the opening of the first electrode and the opening of the second electrode are independent as shown in FIG. 3(a), the short circuit between the electrodes due to position shift etc. of the conductive member can be prevented, and an element that is less likely to be short circuited can be obtained. The bump can be arranged substantially uniformly over the entire element by arranging the opening of the second electrode as above, and thus heat resistance can be reduced.

(Semiconductor Light Emitting Element)

The semiconductor light emitting element may be used an element of rectangular shape in plan view. The first electrodes are arranged in lattice form along the plan view shape of the element. The effect of the present invention can be easily obtained when the first side of the element and the second side adjacent thereto have substantially the same length. The shape is preferably a substantially square shape. In the present embodiment, the semiconductor light emitting element is preferably an element for flip chip mounting for retrieving the light from the transparent substrate side, that is, the opposing surface side of the electrode forming surface. In the case of the flip chip mounting element, the film thickness of the second electrode may be increased, in addition, the connecting region with the external electrode of the second electrode can be uniformly arranged compared to the face up mounting element of retrieving the light from the electrode forming surface. Thus, the current can be easily uniformly spread over the entire second conductivity-type semiconductor layer. Thus the current distribution of the entire element can be uniformed by the arrangement of the first electrode, and the effects of the present invention can be easily obtained.

Second Embodiment

Figure 4:
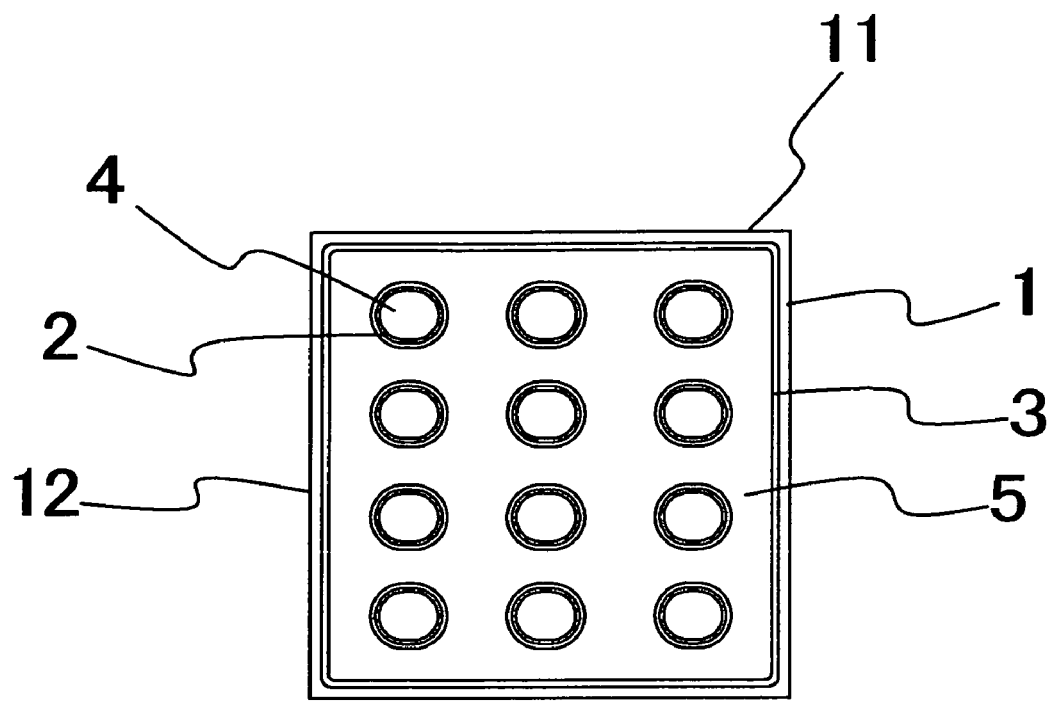
FIG. 4 is a schematic plan view showing a semiconductor light emitting element according to a second embodiment of the present invention.

The semiconductor light emitting element shown in FIG. 4 has the first electrode 4 arrayed in lattice form of three columns along the first side 11 and four rows along the second side 12. The other configurations may be the same as those of the first embodiment. Thus, the number and the arrangement of the first electrode 4 may be changed in correspondence to the size of the first electrode, the size of the element, and the like. The first electrodes are preferably arranged at equidistance also in the row direction.

Third Embodiment

Figure 5:
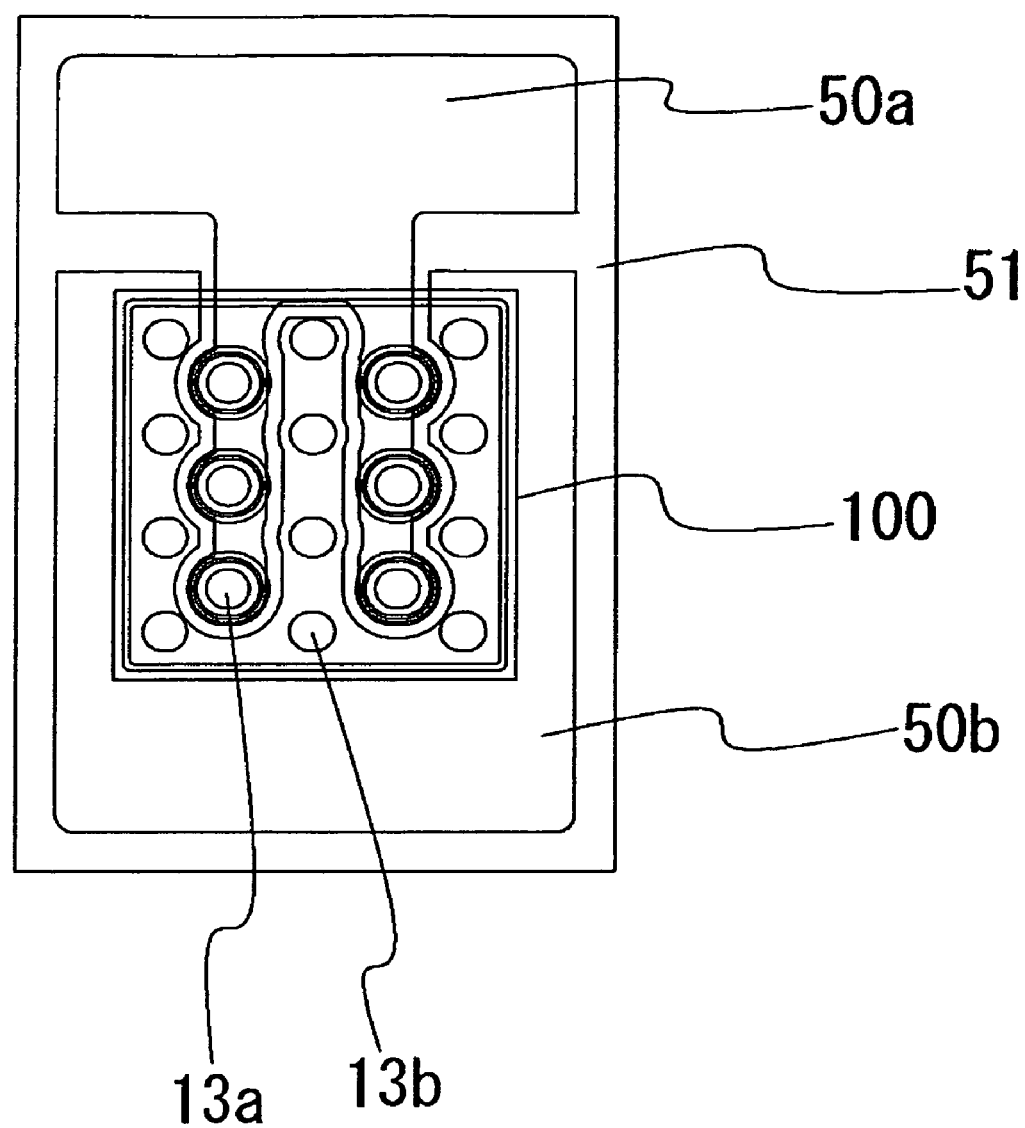
FIG. 5 is a schematic plan view showing a light emitting device according to a third embodiment of the present invention.

A semiconductor light emitting device shown in FIG. 5 has the semiconductor light emitting element 100 shown in FIG. 1 flip chip mounted on a wiring substrate. In the light emitting device shown in FIG. 5, the first electrode and the second electrode of the light emitting element 100 are respectively connected to a first wiring electrode 50a and a second wiring electrode 50b of the surface of the base body 51 of the wiring substrate through connecting parts 13a and 13b. The conductive member such as bump can be used for the connecting parts 13a and 13b.

Figure 6:
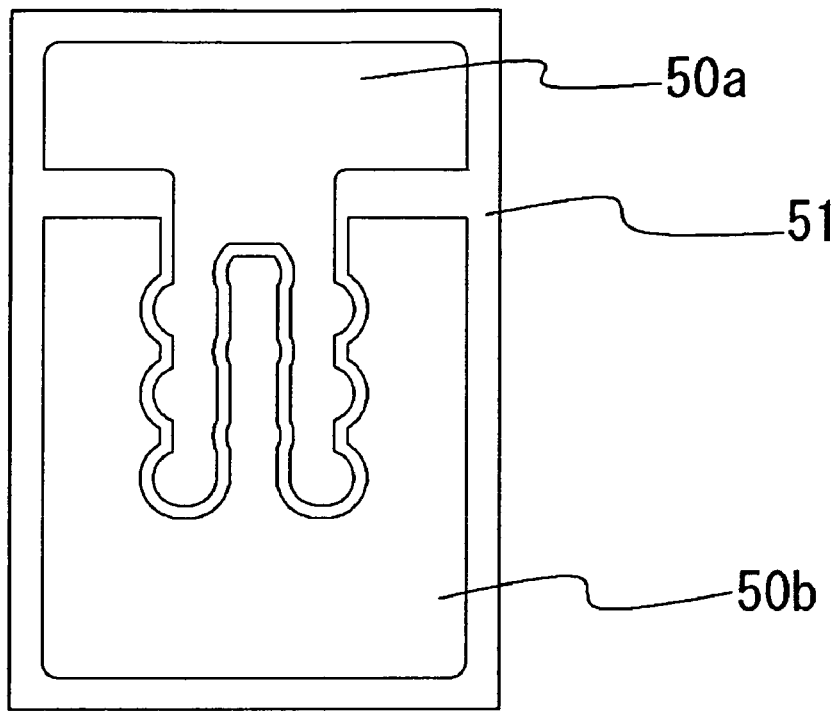
FIG. 6 is a schematic plan view showing a wiring substrate according to the third embodiment of the present invention.

FIG. 6 shows a pattern of the wiring electrodes 50a and 50b of the wiring substrate in the light emitting device of FIG. 5. As shown in FIGS. 5 and 6, the first wiring electrode 50a extends straight along the second side 12 of the semiconductor light emitting element corresponding to the array of the first electrode. The second wiring substrate 50b similarly extends straight in the same direction as the first wiring electrode 50a. The path in which the current of the wiring electrode flows has a substantially linear shape, so that a light emitting device having a lower wiring resistance than that arranged with a complex intertwined wiring electrode can be obtained. Wiring electrode has a shape long in the direction of the second side 12 along the array of the first electrode, and thus the area of the first wiring electrode 50a can be reduced and the area of the second wiring electrode 50b can be increased. According to such wiring electrode, great number of connecting parts of the p-electrode and the wiring electrode may be arranged. It is particularly preferable in a case where the p-type gallium nitride compound semiconductor layer in which current is less likely to spread than the n-type gallium nitride compound semiconductor layer is used as the second conductivity-type semiconductor layer. In the third embodiment, such wiring electrode is obtained since the first electrode of the light emitting element is arranged in a lattice form such that the number in the second side direction is greater than the number in the first side direction.

When including the light emitting layer 10 immediately below the second electrode 5 as in the light emitting element shown in FIG. 2, the connecting part 13b for connecting the second electrode and the second wiring electrode is preferably arranged on the outer side of the element than at least the connecting part 13a for connecting the first electrode and the first wiring electrode, as shown in FIG. 5. The second wiring electrode 50b to be joined with the connecting part 13b thus can be arranged on the outer side of the element than the first wiring electrode 50a, whereby the width of the second wiring electrode 50b can be widened, and the heat discharge effect can be enhanced. That is, the width of the wiring electrode joined with the electrode of the element at inside the element is limited by the element structure, but the wiring electrode can be extended in the direction to the outside of the element in plan view with the wiring electrode described above, and thus the width thereof may be wider than that of the wiring electrode on the inner side of the element. Specifically, as shown in FIGS. 5 and 6, the width of the second wiring electrode 50b on the outer side of the element may be wider than the width of the second wiring electrode 50b on the inner side of the element and the first wiring electrode 50a.

In the case of the light emitting element as shown in FIG. 2, the second electrode 5 is closer to the light emitting layer 10 than the first electrode 4, and the p-type gallium nitride semiconductor layer is often typically used as the second conductivity-type semiconductor layer 3, and thus the second electrode 5 side tends to easily generate heat. In the case of such element structure, the second wiring electrode of high heat discharge effect tends to be strongly desired, and thus the pattern of arranging the second wiring electrode on the outer side of the element is preferable. One of either the pattern of arranging the second wiring electrode on the outer side of the element or the pattern of extending each wiring electrode substantially linearly may be used, but a pattern using both patterns is preferable as in the semiconductor light emitting device shown in FIG. 5.

Furthermore, a light emitting device capable of reflecting the light from the end face of the light emitting element at the wiring electrode and having high light retrieval efficiency can be obtained by having the second wiring electrode 50b of wide width so as to be exposed from the semiconductor light emitting element 100 in plan view, as shown in FIG. 5. When the element is arranged in plurals, the wiring electrode can be arranged so as to cover the space between the adjacent elements by arranging such second wiring electrode of wide width between the elements, whereby the light from end faces of both elements can be reflected, and thus is preferable.

The connecting part for electrically connecting the electrode of the element and the wiring electrode of an arbitrary size can be arranged at an arbitrary position. The heat resistance can be reduced if the connecting part is evenly arranged over the entire element. Specifically, as shown in FIG. 5, the connecting parts 13a are arranged in correspondence to the first electrodes and the connecting parts 13b are arrayed in a lattice form so that the column in the direction of the first side and the column in the direction of the second side both are one greater than the first electrodes, so that the connecting parts 13a and the connecting parts 13b can be evenly arranged over the entire element.

The connecting parts 13a and 13b in FIG. 5 show in frame format the positions at where each electrode of the light emitting element 100 and each wiring electrode of the wiring substrate are connected. For instance, the protective film 30 opened at the relevant region may be arranged, and the bump may be arranged in the opening to connect the electrode of the element and the wiring electrode, as shown in FIG. 3.

(Wiring Substrate)

Au, Al and the like are used for the metal serving as the material of the wiring electrode. The metal of silver white color having high reflectivity such as Al is preferably used as the light from the light emitting element is reflected in the direction opposite to the wiring substrate, and the light retrieval efficiency of the light emitting device enhances. The metal serving as the material of the wiring electrode is preferably selected in view of the adherence between the metals, so-called wetness, and the like. For instance, the wiring electrode is Au or alloy containing Au when bonding the electrodes of the semiconductor light emitting element containing Au through the Au bump.

The first wiring electrode 50a is arranged at the position facing the first electrode of the light emitting element 100, and the second wiring electrode 50b is similarly arranged in a region facing the second electrode in the wiring substrate shown in FIGS. 5 and 6. Since the light emitting element shown in FIG. 2 has the ends of the semiconductor layer exposed from the light shielding member such as the electrode, the light in the element can also exit from the ends of the semiconductor layer.

Specifically, the light may leak out from the ends of the element and the ends of the semiconductor layer between the first electrode and the second electrode. Thus, the leaked light can be reflected at the wiring electrode and the light flux of the light emitting device can be further enhanced by arranging the wiring electrode on the surface of the wiring substrate facing such region. In the light emitting device shown in FIG. 5, for example, the first wiring electrode 50*a* to be joined to the first electrode of the light emitting element 100 is arranged extended to the position facing the second electrode. Such configuration can obtain a large effect especially when using material that easily absorbs light from the light emitting element such as aluminum nitride for the material of the base body of the wiring substrate.

First Example

As the first example, the semiconductor light emitting element similar to the structure shown in FIG. 1 is used. The semiconductor light emitting element according to the first example is an element of substantially square shape in plane in which one side is about 1 mm. Gallium nitride compound semiconductor is stacked on a sapphire substrate, and an n-type semiconductor layer, a light emitting layer, and a p-type semiconductor layer are stacked in order from the substrate side. The sapphire substrate is exposed at the outer periphery portion of the element. An entire surface electrode which reflects the light from the light emitting layer, a cover electrode covering the same, and a pad electrode are arranged as the second electrode on the surface of the p-type semiconductor layer, and the n-electrode is arrayed in a lattice form of two columns along the first side and three rows along the second side as the first electrode on the surface of the n-type semiconductor layer exposed from the p-type semiconductor layer. The first electrodes all have a substantially circular shape long in the same direction. Specifically, the first electrodes have a shape of connecting two semicircles with a line segment. Regarding the material of electrodes, the entire surface electrode on the p-side uses Ni/Ag/Ni/Ti/Pt, the cover electrode uses Au, the pad electrode uses Au/Rh/Pt/Au/Ni, and the n-electrodes uses Al—Si—Cu/W/Pt/Au/Ni. The Ni/Ag/Ni/Ti/Pt means forming the electrode by stacking Ni, Ag, Ni, Ti, and Pt in order from the semiconductor layer side. Obtaining the forward voltage through simulation for such semiconductor light emitting element, about 3.4V is estimated.

Second Example

Figure 7:
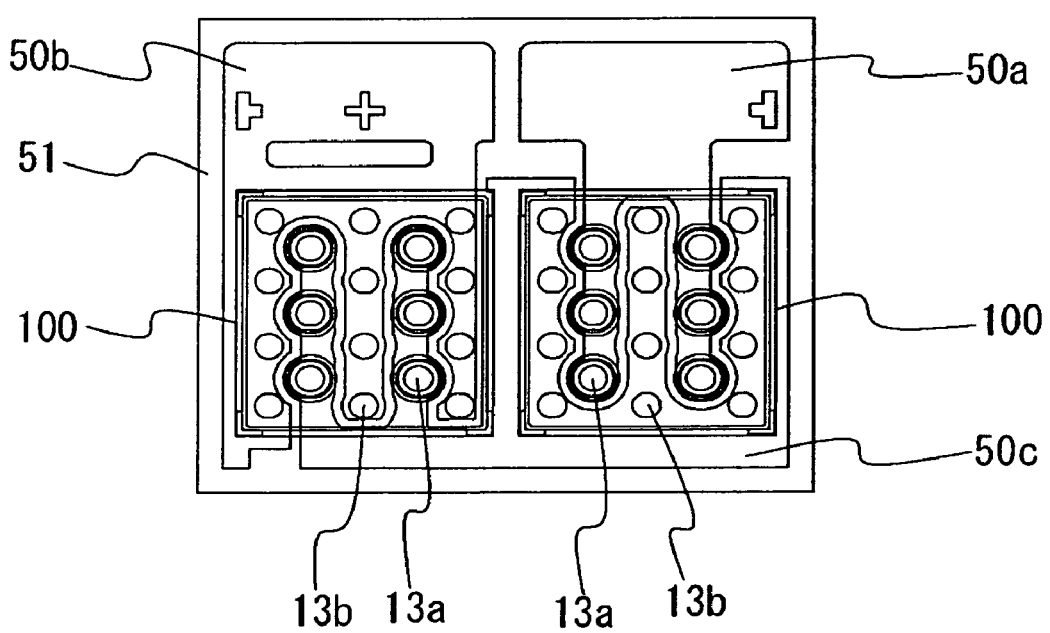
FIG. 7 is a schematic plan view showing a light emitting device according to a second example of the present invention.
Figure 8:
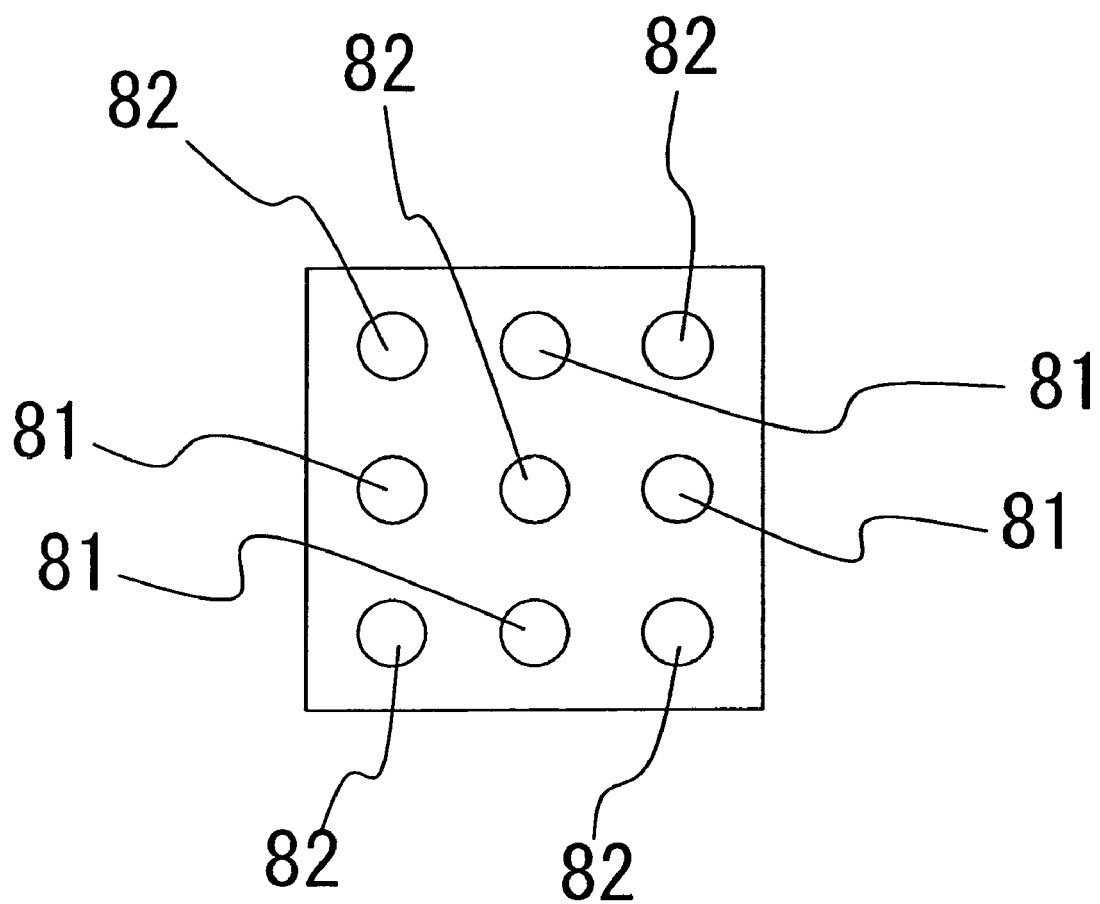
FIG. 8 is a schematic plan view showing a semiconductor light emitting element of the background art.

FIG. 7 shows a light emitting device of the second example in which two elements 100 similar to the first example other than that the p-side pad electrode is omitted and the cover electrode is Ni/Au/Ni are lined and flip chip mounted on the wiring substrate. The first wiring electrode 50*a* and the second wiring electrode 50*b* have substantially the same shape as those shown in FIGS. 5 and 6, but a third wiring electrode 50*c* is arranged to connect the two light emitting elements 100 in series in the light emitting device shown in FIG. 7. Similar to the first and second wiring electrodes 50*a* and 50*b*, the third wiring electrode 50*c* is also extended substantially linearly in the same direction, and connects to a first electrode on the left element side and connects to a second electrode on the right element side in FIG. 7. The portion connecting to the second wiring electrode of the third wiring electrode 50*c* has the width made to be wider than other portions to cover the surface of the base body between two elements, and thus can reflect the light from the end faces of two elements. When two such light emitting device are lined, the forward voltage is about 14.1 V, and the light flux is about 476.8 lumens.

It should be apparent to those skilled in the art that the present invention may be embodied in many other specific forms without departing from the spirit or scope of the invention. Therefore, the present invention is not to be limited to the details given herein, but may be modified within the scope and equivalence of the appended claims.

What is claimed is:

1. A semiconductor light emitting element having a rectangular shape in plan view including at least a first side and a second side adjacent to the first side, the semiconductor light emitting element comprising:
    a first conductivity-type semiconductor layer;
    a second conductivity-type semiconductor layer;
    a plurality of first electrodes each having a shape longer along the first side than the second side, the plurality of first electrodes being arranged on the first conductivity-type semiconductor layer in a rectangular lattice form of x columns ($x \geq 2$) along the first side and y rows ($y > x$) along the second side; and
    a second electrode arranged on the second conductivity-type semiconductor layer,
    wherein the first electrode and the second electrode are arranged on the same surface side, and the first electrode is surrounded by the first conductivity-type semiconductor layer, the second conductivity-type semiconductor layer, and the second electrode.

2. The semiconductor light emitting element according to claim 1,
    wherein a distance $D_1$ is larger than a distance $D_2$, and
    wherein $D_1$ is a distance between the first electrodes in the row direction, and $D_2$ is a distance between the first electrodes in the column direction.

3. The semiconductor light emitting element according to claim 1,
    wherein the plurality of first electrodes are arranged at essentially equidistance in the row direction, and a distance $D_1$ is larger than a distance $D_3$, and
    wherein $D_1$ is a distance between the first electrodes in the row direction, and $D_3$ is a distance between the first electrode closest to the second side and an end of the second conductivity-type semiconductor layer on the second side.

4. The semiconductor light emitting element according to claim 3, wherein the distance $D_1$ is smaller than or equal to twice the distance $D_3$.

5. The semiconductor light emitting element according to claim 1,
    wherein the plurality of first electrodes are arranged at essentially equidistance in the column direction, and a distance $D_2$ is the same as or smaller than a distance $D_4$, and
    wherein $D_2$ is a distance between the first electrodes in the column direction, and $D_4$ is a distance between the first electrode closest to the first side and an end of the second conductivity-type semiconductor layer on the first side.

6. The semiconductor light emitting element according to claim 1, wherein the plurality of first electrodes have the same size and shape.

7. The semiconductor light emitting element according to claim 1, wherein the first electrode has a substantially oval shape which is longer along the first side than the second side.

8. The semiconductor light emitting element according to claim 1, wherein the lengths of the first side and the second side are substantially equal.

9. The semiconductor light emitting element according to claim 8, wherein the semiconductor light emitting element has a substantially square shape in plan view.

10. The semiconductor light emitting element according to claim 1, wherein the first conductivity-type semiconductor layer is an n-type gallium nitride compound semiconductor layer, and the second conductivity-type semiconductor layer is a p-type gallium nitride compound semiconductor layer.

11. The semiconductor light emitting element according to claim 1, wherein the semiconductor light emitting element is a flip chip element.

12. A semiconductor light emitting element having a rectangular shape in plan view including at least a first side and a second side adjacent to the first side, the semiconductor light emitting element comprising:
a first conductivity-type semiconductor layer;
a second conductivity-type semiconductor layer;
a plurality of first electrodes each having a shape longer along the first side than the second side, the plurality of first electrodes being arranged on the first conductivity-type semiconductor layer in a rectangular lattice form of x columns ($x \geq 2$) along the first side and y rows ($y > x$) along the second side; and
a second electrode arranged on the second conductivity-type semiconductor layer,
wherein the first electrode and the second electrode are arranged on the same surface side, and the first electrode is surrounded by the first conductivity-type semiconductor layer, the second conductivity-type semiconductor layer, and the second electrode,
wherein a distance $D_1$ is larger than a distance $D_2$, and
wherein $D_1$ is a distance between the first electrodes in the row direction, and $D_2$ is a distance between the first electrodes in the column direction.

13. The semiconductor light emitting element according to claim 12,
wherein the plurality of first electrodes are arranged at essentially equidistance in the row direction, and the distance $D_1$ is larger than a distance $D_3$, and
wherein $D_3$ is a distance between the first electrode closest to the second side and an end of the second conductivity-type semiconductor layer on the second side.

14. The semiconductor light emitting element according to claim 13, wherein the distance $D_1$ is smaller than or equal to twice the distance $D_3$.

15. The semiconductor light emitting element according to claim 14, wherein the first electrode has a substantially oval shape being longer along the first side than the second side.

16. A semiconductor light emitting element having a rectangular shape in plan view including at least a first side and a second side adjacent to the first side, the semiconductor light emitting element comprising:
a first conductivity-type semiconductor layer;
a second conductivity-type semiconductor layer;
a plurality of first electrodes each having a shape longer along the first side than the second side, the plurality of first electrodes being arranged on the first conductivity-type semiconductor layer in a rectangular lattice form of x columns ($x \geq 2$) along the first side and y rows ($y > x$) along the second side; and
a second electrode arranged on the second conductivity-type semiconductor layer,
wherein the first electrode and the second electrode are arranged on the same surface side, and the first electrode is surrounded by the first conductivity-type semiconductor layer, the second conductivity-type semiconductor layer, and the second electrode,
wherein the plurality of first electrodes are arranged at essentially equidistance in the row direction, and a distance $D_1$ is larger than a distance $D_3$, and
wherein $D_1$ is a distance between the first electrodes in the row direction, and $D_3$ is a distance between the first electrode closest to the second side and an end of the second conductivity-type semiconductor layer on the second side.

17. The semiconductor light emitting element according to claim 16,
wherein the plurality of first electrodes are arranged at essentially equidistance in the column direction, and a distance $D_2$ is the same as or smaller than a distance $D_4$, and
wherein $D_2$ is a distance between the first electrodes in the column direction, and $D_4$ is a distance between the first electrode closest to the first side and an end of the second conductivity-type semiconductor layer on the first side.

18. The semiconductor light emitting element according to claim 17, wherein the plurality of first electrodes have the same size and shape.

19. The semiconductor light emitting element according to claim 18, wherein the semiconductor light emitting element has a substantially square shape in plan view.

20. The semiconductor light emitting element according to claim 19, wherein the plurality of first electrodes are arrayed in a rectangular lattice form of two columns along the first side and three rows along the second side.

* * * * *